United States Patent [19]
Villain et al.

[11] Patent Number: 5,825,606
[45] Date of Patent: Oct. 20, 1998

[54] COMMUNICATIONS SET WITH ELECTROSTATIC PROTECTION

[75] Inventors: Jean-Christophe Villain, Paris; Alain Bezieres, St. Cenere, both of France

[73] Assignee: Alcatel Mobile Phones, Paris, France

[21] Appl. No.: 682,358

[22] Filed: Jul. 17, 1996

[30] Foreign Application Priority Data

Jul. 18, 1995 [FR] France .................................. 95 08670

[51] Int. Cl.⁶ ...................................................... H02H 3/00
[52] U.S. Cl. ............................................ 361/220; 361/212
[58] Field of Search ............................... 361/56, 58, 110, 361/111, 117, 119, 212, 220, 816, 818; 220/402, 403, 410; 174/35 R, 35 MS, 35 GC; 455/89, 90, 100; 379/437, 440

[56] References Cited

U.S. PATENT DOCUMENTS

| 4,471,493 | 9/1984 | Schober | 455/90 |
| 5,031,076 | 7/1991 | Kiku | 361/816 |
| 5,383,097 | 1/1995 | DeLucia et al. | 361/816 |

FOREIGN PATENT DOCUMENTS

| 0467726A1 | 1/1992 | European Pat. Off. | G06K 19/06 |
| 4041071A1 | 6/1991 | Germany | H05K 9/00 |

OTHER PUBLICATIONS

IBM Disclosure Bulletin, vol. 30, No. 1, Jun. 1987, New Yorik, pp. 237–238, "Shield Arrangements."
Patent Abstracts of Japan, vol. 18, No. 69 (E–1502), 4 Feb. 1994 corresponding to JP–A–05 284268 (Matsushita Graphic Commun Syst Inc).

Primary Examiner—Ronald W. Leja
Attorney, Agent, or Firm—Sughrue, Mion, Zinn, MacPeak & Seas, PLLC

[57] ABSTRACT

The electrostatic protection consists in a protective sheet incorporated in the set between the shell and the elements to be protected, the sheet comprising a conductive layer and an insulating layer, the sheet being cut to the appropriate shape, and being made of materials, such as a foam made of a plastics material, that make it easily formable so that it fits the shape of a space left empty to receive it inside the set. The conductive layer is a thin sheet of metal or of metal fibers.

7 Claims, 2 Drawing Sheets

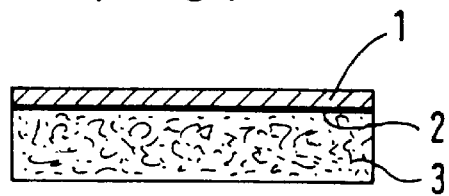
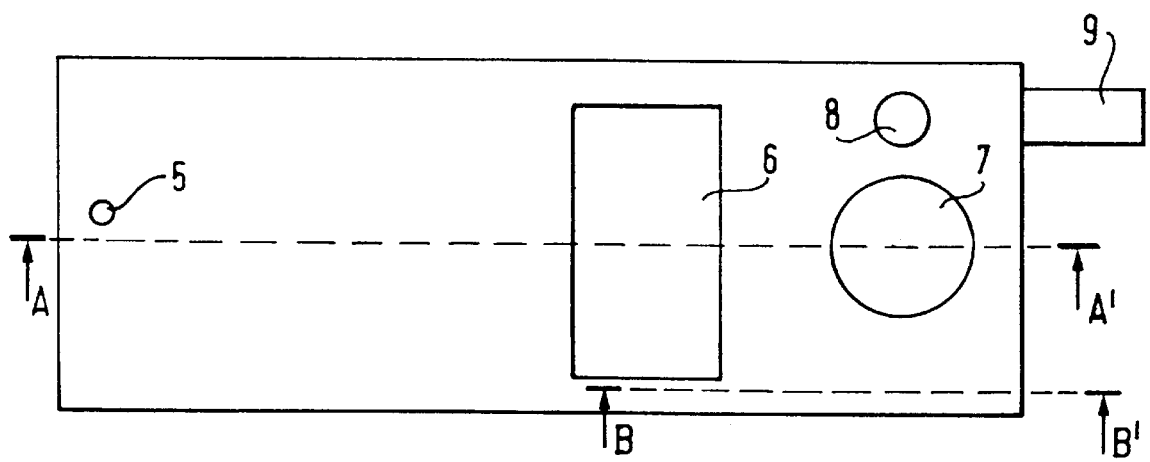
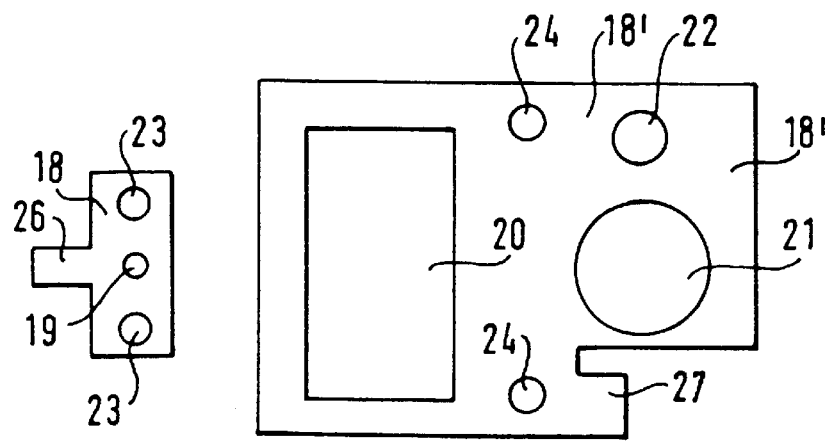

COMMUNICATIONS SET WITH ELECTROSTATIC PROTECTION

The invention relates to a communications set provided with electrostatic protection comprising a flat body made of an insulating material.

BACKGROUND OF THE INVENTION

Patent document GB-2 241 628 discloses an acoustic receiver which is provided with an electrostatic protection plate. Patent document US-5,053,167 discloses a rubber article that can be used, inter alia, as electrostatic protection.

In the first document, the problem of providing electrostatic protection is approached from the point of view of preventing electrostatic discharge by increasing the discharge distances. The source of such discharge lies outside of the set: it is constituted by the user of the set, and such discharge must be prevented from reaching the fragile electronic devices inside the set.

In the second document, electrostatic protection is merely mentioned. It can however be understood that attempts are made to prevent electrostatic charge from building up by grounding it.

In both cases, only electrostatic discharge protection is dealt with. Other aspects of protection are not tackled. Also in both cases, the protection is based on using specific and therefore relatively costly parts.

OBJECTS AND SUMMARY OF THE INVENTION

The present invention relates to a communications set of the type mentioned at the beginning of this document, in which set the electrostatic protection provides electrostatic discharge protection, but it is also capable of performing other protection functions, and it is obtained by cheap means.

Admittedly, Document U.S. Pat. No. 5,383,097 discloses a set provided with electrostatic protection comprising a flat body made of an insulating material, the electrostatic protection consisting in a protective sheet incorporated in the set between the shell and the elements to be protected, the protective sheet comprising a conductive layer and an insulating layer, and being cut to the appropriate shape. However, the protective sheet used is relatively rigid (Mylar), and provision is made for no other use than that of electrostatic protection.

According to the invention, said insulating layer is a she et of foam made of a plastics material and organized to fit the shape of a space left empty to receive it inside the set.

In an embodiment, said conductive layer is a thin sheet of metal or of metal fibers, the thin sheet being covered with an adhesive layer.

In an embodiment, said conductive layer is provided with grounding connector means. Preferably, these means consist in a tab provided on said protective sheet, and the set includes a pusher for pressing the tab against a grounding contact zone.

Also in an embodiment, said insulating layer is a sheet of polyurethane foam.

It is clear that such a protective sheet is cheap because it is obtained merely by being cut out of a sheet of cheap material, and it is easy and cheap to install in the set.

Preferably, the cut-out protective sheet has a thickness, relative to said empty space, such that it is compressed in at least certain places.

It then also serves the purpose of providing sealing against sound and dust.

BRIEF DESCRIPTION OF THE DRAWINGS

The various objects and characteristics of the present invention appear more clearly in the following description of an embodiment of the invention given by way of non-limiting example and with reference to the accompanying drawings, in which:

FIG. 1 is a section view through a portion of the protective sheet used in the present invention;

FIG. 2 is a plan view of a radiotelephone set to which the present invention is applied;

FIG. 4 is a plan view of a protective sheet prior to it being used in the set shown in FIGS. 2 and 3.

MORE DETAILED DESCRIPTION

Figure 3:
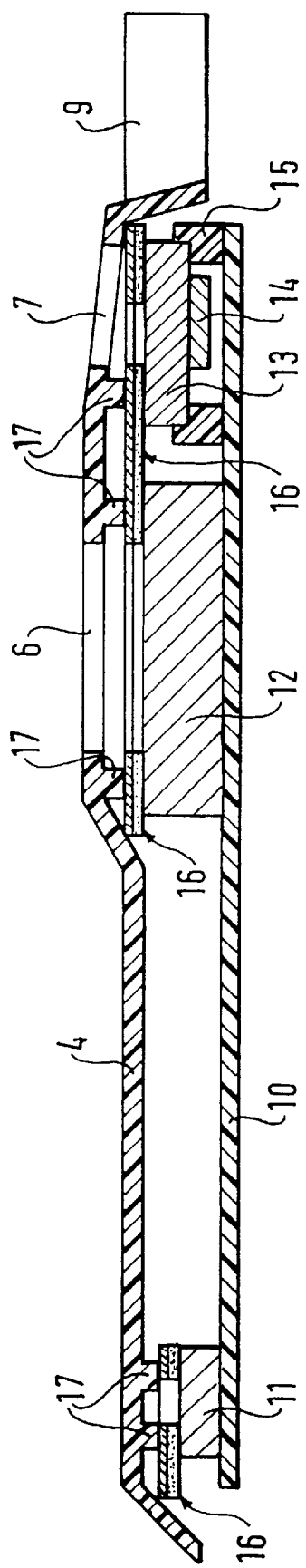
FIG. 3 is a simplified view partially in section, on a is A–A' shown in FIG. 2, of the radiotelephone set shown in FIG. 2, provided with a protective sheet as shown in FIG. 1.

In the communications set provided with electrostatic protection of the invention, comprising a flat body made of an insulating material, the electrostatic protection consists in a protective sheet incorporated in the set between the shell and the elements to be protected, the sheet comprising a conductive layer and an insulating layer, the sheet being cut to the appropriate shape, and being made of materials that make it easily formable so that it fits the shape of a space left empty to receive it inside the set.

An example of such a protective sheet is shown in FIG. 1. As mentioned above, the protective sheet shown comprises a conductive layer 1, an adhesive layer 2, and an insulating layer 3. The adhesive layer may have been disposed initially on the conductive layer 1 so as to stick said conductive layer onto the insulating layer 3. Conversely, it is also possible for the adhesive layer 2 to be disposed initially on the insulating layer 3 so as to stick said insulating layer onto the conductive layer 1.

In an embodiment, the conductive layer 1 is a thin sheet of conductive metal, e.g. of aluminum, while the insulating layer 3 is a sheet of foam made of a plastics material, e.g. of polyurethane. Alternatively, the conductive layer may be made of metal fibers.

An application of the invention is shown by way of example in FIG. 2 which is a very diagrammatic plan view of a radiotelephone set including a shell 4 in which orifices are cut for a microphone 5, a display 6, an earpiece 7, and a buzzer 8. An antenna 9 is also shown.

On being brought into contact with the user's head, which might be charged with static electricity, such a set could give rise to a discharge which, in addition to being disagreeable for the user, might damage fragile components of the circuits in the set. Furthermore, since cut-outs are provided in the shell, dust from outside might penetrate into the set. Finally inside the shell, the microphone and the earpiece or the buzzer might interfere with each other. Naturally, none of this is acceptable. The invention makes it possible to avoid these drawbacks simply and cheaply.

The solution of the invention is shown in the view partially in section in FIG. 3, the section being taken on a is A—A' shown in FIG. 2.

FIG. 3 shows, very diagrammatically, a printed circuit board 10 carrying a microphone 11, an LCD-type display 12, an earpiece 13, and a buzzer 14. The means for fixing the components to the board 10 are not shown. However, a mounting 15 is shown for appropriately positioning the earpiece 13.

The components are appropriately positioned when the shell 4 is in place relative to the board 10, i.e. when they face the corresponding orifices. The components are connected to electronic circuits (not shown) via connections (not shown either) which are in the vicinity of the orifices in the shell, and which can convey electrostatic discharge currents originating from a portion of the body or the clothing of the user.

To protect the circuits and the user from such discharge, the invention provides a protective sheet 16 incorporated in the set between the shell 4 and the elements to be protected, i.e. the components 11, 12, 13, 14. The sheet is as defined in the description given with reference to FIG. 1.

Advantageously, the shell 4 further includes sealing ribs 17 extending towards the surfaces of the components 11, 2, 13, 14. The sheet 16 may be made up of a plurality of portions, each of which is shaped to fit the components or the portions of the set to be protected, as explained below. Its conductive layer faces towards the shell and bears against the ribs, while only its insulating layer bears against the components.

The thickness of the protective sheet relative to the space left empty between the shell 4 and the components carried by the board 10 is such that, because of the ribs 17, the sheet is compressed, thereby providing sealing against sound and dust around the components, and insulating each component relative to the others in the shell 4.

FIG. 4 shows how the sheet 16 is cut out so as to be used in the set shown in FIGS. 2 and 3. The sheet comprises two portions 18 and 18'. Portion 18 is provided around the microphone 11, as shown in FIG. 3. Portion 18' corresponds to that zone of the set which includes the display 12, the earpiece 13, and the buzzer 14, as also shown in FIG. 3. Protective sheet portion 18 is provided with a punched-out hole 19 enabling sound to pass towards the microphone 11. Protective sheet portion 18' is similarly provided with a punched-out hole 20 or uncovering the screen of the display, and with punched-out holes 21 and 22 for enabling the sound produced by the two other components in said zone to pass.

Each of the portions 18 and 18' is further provided with perforations 23, for portion 18, and 24, for portion 18' which perforations are centering holes facilitating installation of the protective sheet portions inside the shell 4. For this purpose, the shell is provided with centering lugs, only one of which (25) is shown in FIG. 5, as described below.

Each of the portions 18, 18' is also provided with a respective grounding tab 26, 27.

Figure 5:
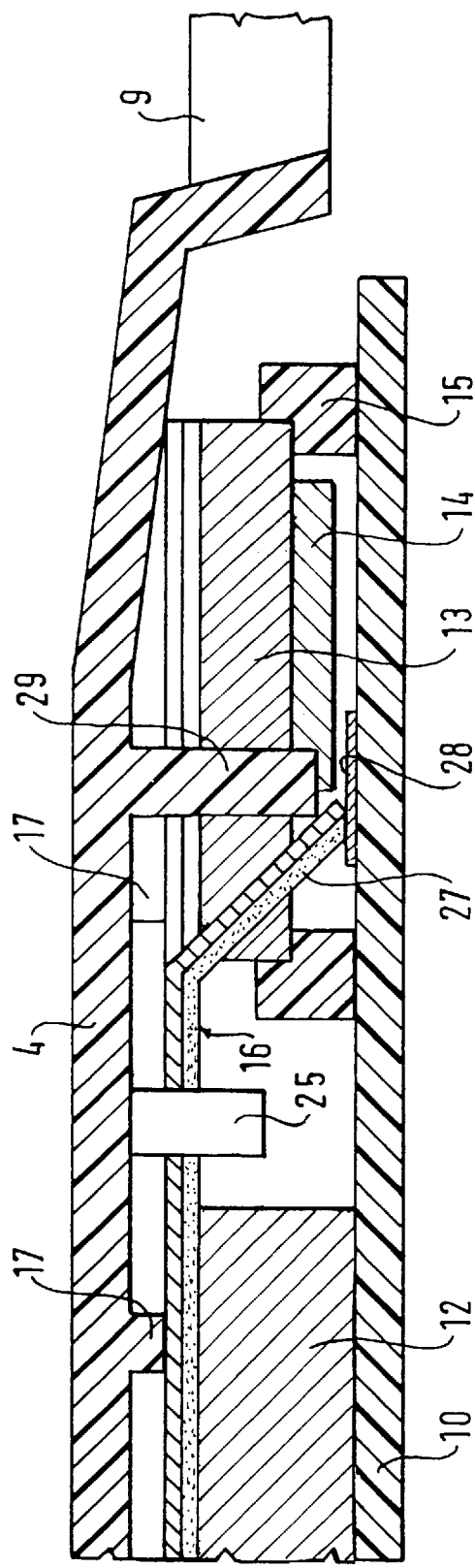
FIG. 5 is a view partially in section, and on an enlarged scale compared with FIGS. 2 and 3, of the set shown in FIG. 2, the section being taken on line B–B' shown in FIG. 2.

FIG. 5 is a view partially in section and on an enlarged scale of the set shown in FIGS. 2 and 3, the section being taken on line B—B' shown in FIG. 2. The view shows the shell 4, the printed circuit board 10, the earpiece 13, the buzzer 14, the earpiece support 15, and the protective sheet 16. FIG. 5 also shows a centering lug 5, as indicated above, integral with the shell 4, and a grounding tab 27, a grounding contact zone 28, and a grounding pusher 29, also integral with the shell 4. As shown in FIG. 5, the pusher 29 presses on the tab 27 and directs it towards the grounding contact zone 28 so that the conductive layer 1 comes into electrical contact with the grounding contact zone of the printed circuit board 10, thereby making it possible to drain away any current due to electrostatic discharge to ground, so as to protect the components of the set, i.e. not only those show in the figures (microphone, earpiece, etc.), but also via the board 10, the more sensitive electronic components with which the components shown in the figures are associated.

Similar dispositions are used with respect to the other portion 18 of the protective sheet 16.

We claim:

1. A communications set provided with electrostatic protection comprising a flat body made of an insulating material, the electrostatic protection consisting of a protective sheet incorporated in the set between the shell and the elements to be protected, the protective sheet comprising a conductive layer and an insulating layer, and being cut to an appropriate shape, wherein said insulating layer is a sheet of foam made of a plastics material and organized to fit the shape of a space left empty to receive it inside the set.

2. A set according to claim 1, wherein said conductive layer is a thin sheet of metal or of metal fibers.

3. A set according to claim 2, wherein said thin sheet of metal or of metal fibers, or said insulating layer, is covered with an adhesive layer.

4. A set according to claim 1, wherein said conductive layer is provided with grounding connector means.

5. A set according to claim 4, wherein said connector means consist of a tab provided on said protective sheet, and wherein the set includes a pusher for pressing the tab against a grounding contact zone.

6. A set according to claim 1, wherein said plastics material is polyurethane.

7. A set according to claim 1, wherein the cut-out protective sheet has a thickness, relative to said empty space, such that it is compressed in at least certain places.

* * * * *